United States Patent
Scheidig et al.

[11] Patent Number: 6,064,328
[45] Date of Patent: May 16, 2000

[54] ANALOG/DIGITAL CONVERTER WITH SMALL CREST FACTOR DITHER SIGNAL SUPERPOSED AT AN INPUT SIDE

[75] Inventors: Hardy Scheidig, Pliening; Manfred Mueller, Muehldorf; Roland Minihold, Munich, all of Germany

[73] Assignee: Rohde & Schwarz GmbH & Co. KG, Munich, Germany

[21] Appl. No.: 09/079,950

[22] Filed: May 15, 1998

[30] Foreign Application Priority Data

May 16, 1997 [DE] Germany .................. 197 20 548

[51] Int. Cl.[7] ............................................. H03M 1/12
[52] U.S. Cl. ...................................... 341/155; 341/131
[58] Field of Search .......................... 341/131, 144, 341/155, 120, 126; 348/571–574; 358/443, 457

[56] References Cited

U.S. PATENT DOCUMENTS

| 4,761,634 | 8/1988 | Yamaguchi et al. ............ 341/131 |
| 5,525,984 | 6/1996 | Bunker ............................ 341/131 |

FOREIGN PATENT DOCUMENTS

| 0225641 | 6/1987 | European Pat. Off. ......... H03M 1/20 |
| 0 613 256 A1 | 8/1994 | European Pat. Off. . |
| 36 38 006 A1 | 5/1988 | Germany . |
| WO 87/06079 | 10/1987 | WIPO . |

OTHER PUBLICATIONS

Babu et al., Testing an ADC ... Dither, IEEE Transaction on instrumentation and Measurement, vol. 47, No. 4, pp. 839–848, Aug. 1998.

Wagdy et al. Linearizing ... Digital Dither, IEEE Transactions on Instrumewntation and Measurement, vol. 43, No. 2, pp. 146–150, Apr. 1994.

Wagdy et al., Validity of Uniform ... With Dither, IEEE Transactions on Instrumentation and Measurement, vol. 38, No. 3, pp. 718–722, Jun. 1989.

*Primary Examiner*—Michael Tokar
*Assistant Examiner*—Peguy JeanPierre
*Attorney, Agent, or Firm*—Hill & Simpson

[57] ABSTRACT

In an analog-digital converter, a sine signal angle-modulated with noise or pseudonoise is used as a dither signal. The dither signal is superposed on an analog useful signal that is to be digitized. This signal is then digitized. The dither signal is then filtered out to produce the digitized useful signal.

12 Claims, 1 Drawing Sheet

ANALOG/DIGITAL CONVERTER WITH SMALL CREST FACTOR DITHER SIGNAL SUPERPOSED AT AN INPUT SIDE

BACKGROUND OF THE INVENTION

The present invention relates to an analog/digital converter with a dither signal superposed at the input side. Prior art converters are found in the following references: Manfred Bartz, Large-Scale Dithering Enhances ADC Dynamic Range, Microwaves&RF, May 1993; Large-Scale-Dithered-ADC, Hewlett-Packard Journal, December 1993; Wagdy M.F., Linearizing Average Transfer Characteristics of Ideal ADCs via Analog and Digital Dither, IEEE Transactions on Instrumentation and Measurement, vol.43, no. 2, April 1994; DE 36 38 006; EP 0613 256; WO 87/06079. By means of the dither signal, both the differential and the integral linearity errors of the A/D converter can be improved.

The known use of a noise signal or, respectively, pseudo-noise signal as a dither signal (International reference WO 87/06079) has the disadvantage that the noise signal has a high crest factor (ratio of the peak to the RMS value), which, already at a relatively low RMS value, leads to a significant adverse effect on the useful dynamic range that is the output range. In practice, a crest factor of 5 to 6 can be assumed for a noise signal, which means that the RMS value of the dither signal must not be greater than 4 to 5% of the output range of the A/D converter.

It is also known to use a pure sine signal as a dither signal (German reference DE 36 38 006). By means of such a sine signal, a broad line spectrum with strongly pronounced individual secondary discrete spectral components is produced at the integral non-linearity of the A/D converter, which is disturbing in certain applications, e.g. in a spectrum analyzer.

Corresponding considerations hold for another known measure, namely the use of a pulse-width-modulated periodic triangular or rectangular signal as a dither signal (European reference EP 0 613 256). This known measure, provided for increasing resolution of an A/D converter, leads again spectrally to preferred discrete spectral components, which are disturbing in various applications of such A/D converters, e.g. in spectrum analysis or in digital receivers with IF sampling.

These known modulated or unmodulated sine signals are thus also not suited as dither signals for all applications.

SUMMARY OF THE INVENTION

It is an object of the present invention to provide an A/D converter in which the dither signal has a small crest factor and avoids disturbing discrete spectral components in the operational region.

In general terms the present invention is an analog/digital converter.

At an input side a dither signal is superposed on a useful signal to be digitized. The dither signal is a sine signal angle-modulated with a predetermined signal.

Advantageous developments of the present invention are as follows.

The predetermined signal is a noise signal.

The predetermined signal is a pseudonoise signal.

In the inventive A/D converter, the dither signal is produced by means of angular modulation of a sine signal with a noise signal or a pseudonoise signal (pseudorandom signal). There thereby results a continuous spectrum, free of discrete spectral components, without dominating secondary lines, but nonetheless having a precisely definable amplitude. It is thus particulary suited for what is known as large-scale dithering and for A/D converters that are used in spectrum analyzers. Since no preferred discrete spectral components are present, no disturbing secondary discrete spectral components are produced, even given a strong dither signal of e.g. 20% of the dynamic range of the A/D converter at the integral non-linearity of the converter, as are given in modem pipelined A/D converters.

By a 'pseudo-noise' or, respectively, 'pseudo-random' signal, what is meant is a noise signal generated by a digital algorithm in a pseudorandom generator. The angular modulation can be either a frequency modulation (FM) or a phase modulation (PM), or also any other known digital angular modulation, such as FSK (frequency shift keying) or PSK (phase shift keying). An inventive dither signal has a continuous spectrum without discrete spectral components, the amplitude is determined exclusively via the amplitude of the carrier signal, the crest factor is low and is for example only 1.4, i.e. considerably less than the crest factor of a known noise signal. An increased dither level, and thus a more effective dithering against the effects of the integral non-linearity, is thus possible at the same dynamic loss of the converter. In addition, the dithering signal can be produced very easily, since such components for the production of angle-modulated signals are available as 1-chip solutions in various embodiments. The random or pseudorandom noise signal required for angular modulation can be lower in its RMS voltage by several orders of magnitude than has been possible previously. In addition, a precise controlling of the noise amplitude is omitted, since the frequency or, respectively, phase deviation is of minor significance. An inventive dither signal is particularly suited for what is known as large-scale dithering, in which a higher dithering signal level is used in relation to the dynamic range of the converter, whereby it is however possible to reduce both the integral linearity error and also the repetitive differential non-linearity that occurs due to the use of a multistage quantizer in what are known as pipelined A/D converters.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

DESCRIPTION OF THE PREFERRED EMBODIMENTS

Figure 1:
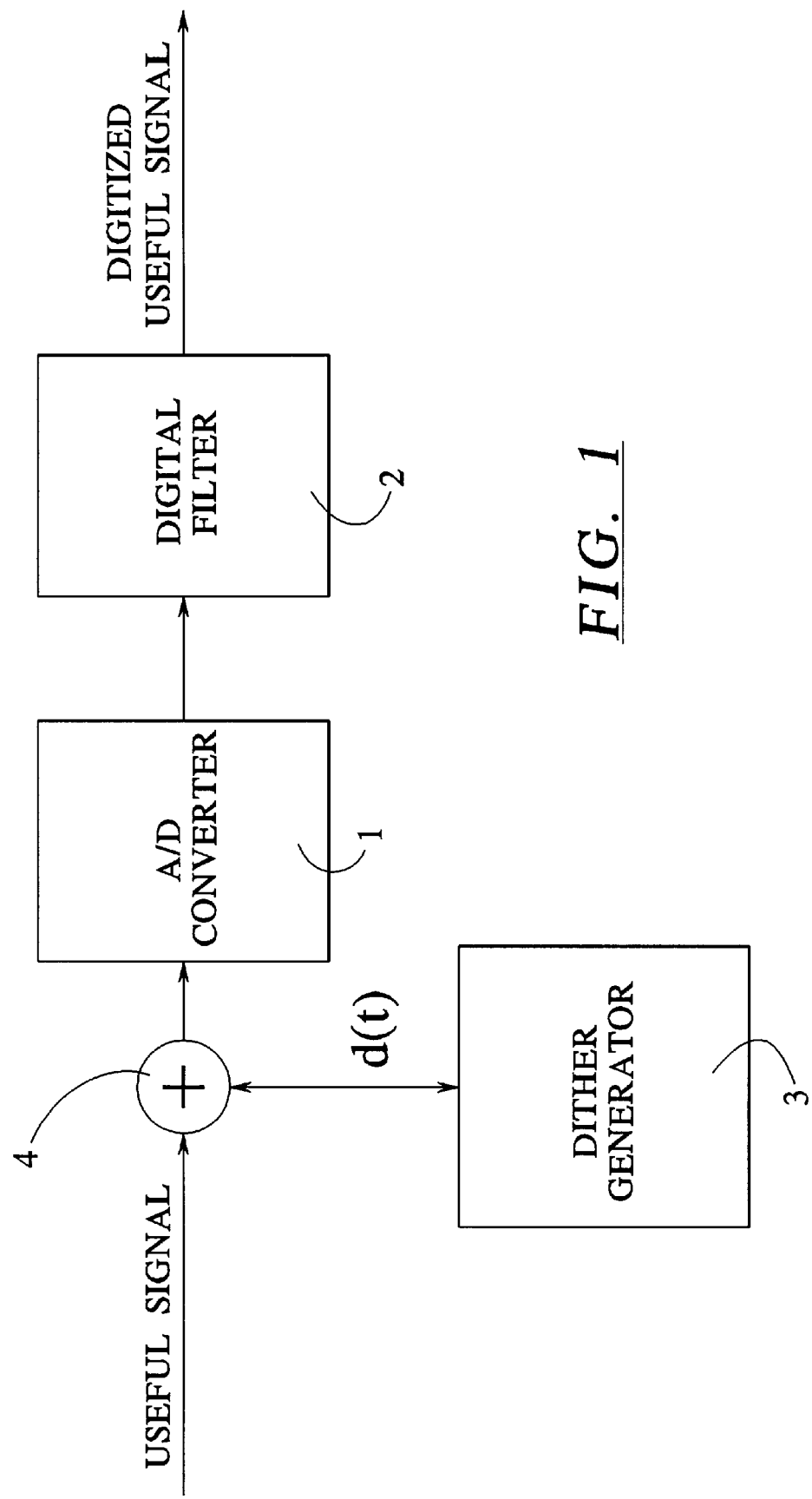
FIG. 1 is a block diagram of the present invention.

FIG. 1 shows the circuit of such an A/D converter. The useful or analog signal to be digital is supplied via a summation unit 4 of the actual A/D converter 1. Via the summation unit 4, a dither signal, produced in a dither signal generator 3, is additively superposed on the useful signal. The signal mixture that results from this is supplied to the input of the A/D converter, and is digitized there. At the output side, the added dither signal is separated from the useful signal by means of a digital filter 2, and the useful signal is finally further processed as a digital signal. In the generator 3, a sine signal is angle-modulated with a noise signal or a pseudonoise signal, in accordance with the following equations:

For frequency modulation:

$$d(t)=U_0*\sin(2*\pi*t*(f_T+r(t))$$

For phase modulation:

$$d(t)=U_0*\sin(2*\pi*t*f_T+r(t))$$

Where, $U_0$ is the amplitude of the dither signal, $f_T$ is the center frequency of the dither signal, and $r(t)$ is the random or pseudo-random noise signal.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An analog/digital converter, comprising:
   an input side at which a dither signal is superposed on an analog signal to be digitized; and
   a dither signal which is a sinusoidal signal which is only angle-modulated with a predetermined signal, the dither signal having a dynamic range up to 20% of the dynamic range of the analog/digital converter.

2. The analog/digital converter according to claim 1, wherein the predetermined signal is a noise signal.

3. The analog/digital converter according to claim 1, wherein the predetermined signal is a pseudonoise signal.

4. The analog/digital converter of claim 1, wherein the dither signal is modulated according to the following relationship:

$$d(t)=U_0*\sin(2*\pi*t*f_T+r(t))$$

where, $U_0$ is the amplitude of the dither signal, $f_T$ is the center frequency of the dither signal, and $r(t)$ is the predetermined signal, the predetermined signal being a random or pseudo-random noise signal.

5. An analog to digital converter, comprising:
   an input side for receiving an analog signal to be digitized;
   an output side for supplying a digitized output signal;
   a dither signal that is superposed on the analog signal at the input side, the dither signal being a sine signal which is only angle modulated with a predetermined signal, the dither signal having a dynamic range up to 20% of the dynamic range of the analog/digital converter; and
   a digital filter for removing the dither signal from the analog signal at the output side to produce said digitized output signal.

6. The analog/digital converter according to claim 5, wherein the predetermined signal being a noise signal.

7. The analog/digital converter according to claim 5, wherein the predetermined signal being a pseudonoise signal.

8. The analog to digital converter of claim 5, wherein the dither signal is modulated according to the following relationship:

$$d(t)=U_0*\sin(2*\pi*t*f_T+r(t))$$

where, $U_0$ is the amplitude of the dither signal, $f_T$ is the center frequency of the dither signal, and $r(t)$ is the predetermined signal, the predetermined signal being a random or pseudo-random noise signal.

9. A method of converting an analog signal to a digital signal, the method comprising the steps of:
   receiving an analog signal at an input of an analog/digital converter;
   superposing a dither signal on the analog signal upstream of the input of the analog/digital converter, the dither signal being a sine signal which is only angle-modulated with a predetermined signal, the dither signal having a dynamic range up to 20% of the dynamic range of the analog/digital converter;
   digitizing the analog signal to produce a digital signal;
   filtering out the dither signal from the digital signal to produce an output signal that is the analog signal in digital form.

10. The analog/digital converter according to claim 9, wherein the predetermined signal is a noise signal.

11. The analog/digital converter according to claim 9, wherein the predetermined signal is a pseudonoise signal.

12. The method of claim 9, wherein the dither signal is modulated according to the following relationship:

$$d(t)=U_0*\sin(2*\pi*t*f_T+r(t))$$

where, $U_0$ is the amplitude of the dither signal, $f_T$ is the center frequency of the dither signal, and $r(t)$ is the predetermined signal, the predetermined signal being a random or pseudo-random noise signal.

* * * * *